United States Patent
Lee et al.

(10) Patent No.: US 10,121,915 B2
(45) Date of Patent: Nov. 6, 2018

(54) SOLAR CELL AND MANUFACTURING METHOD THEREOF

(75) Inventors: Daeyong Lee, Seoul (KR); Junyong Ahn, Seoul (KR); Jihoon Ko, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 487 days.

(21) Appl. No.: 13/137,573

(22) Filed: Aug. 26, 2011

(65) Prior Publication Data

US 2012/0048365 A1  Mar. 1, 2012

(30) Foreign Application Priority Data

Aug. 27, 2010 (KR) .................. 10-2010-0083549
Sep. 10, 2010 (KR) .................. 10-2010-0088890

(51) Int. Cl.
*H01L 31/0224* (2006.01)
*H01L 31/18* (2006.01)

(52) U.S. Cl.
CPC ...... *H01L 31/022425* (2013.01); *H01L 31/18* (2013.01); *Y02E 10/50* (2013.01)

(58) Field of Classification Search
CPC .................. H01L 31/022425; H01L 31/18
See application file for complete search history.

(56) References Cited

U.S. PATENT DOCUMENTS

| | | | | |
|---|---|---|---|---|
| 2007/0295399 | A1* | 12/2007 | Carlson | H01L 31/022433 136/261 |
| 2008/0000519 | A1 | 1/2008 | Takahashi | |
| 2009/0007962 | A1* | 1/2009 | Wenham et al. | 136/256 |
| 2009/0173379 | A1 | 7/2009 | Kim | |
| 2009/0325327 | A1* | 12/2009 | Rohatgi et al. | 438/17 |
| 2010/0084009 | A1* | 4/2010 | Carlson et al. | 136/255 |
| 2010/0098840 | A1* | 4/2010 | Du et al. | 427/75 |
| 2010/0163101 | A1* | 7/2010 | Kumar et al. | 136/256 |

(Continued)

FOREIGN PATENT DOCUMENTS

| | | |
|---|---|---|
| EP | 2 068 369 A1 | 6/2009 |
| JP | 2002-270869 A | 9/2002 |

(Continued)

OTHER PUBLICATIONS

Gautero et al., "All-Screen-Printed 120-µM-Thin Large-Area Silicon Solar Cells Applying Dielectric Rear Passivation and Laser-Fired Contacts Reaching 18% Efficiency", IEEE, pp. 001888-001893, 2009.

(Continued)

*Primary Examiner* — Lindsey A Bernier
(74) *Attorney, Agent, or Firm* — Birch, Stewart, Kolasch and Birch, LLP

(57) ABSTRACT

A method for manufacturing a solar cell includes forming a passivation layer on a rear surface of a substrate of a first conductivity type; forming connecting electrodes having a plurality of electrical contacts that are in contact with the rear surface of the substrate by using a first paste for a first temperature firing on portions of the passivation layer; and forming a rear electrode layer by using a second paste for a second temperature firing on the passivation layer and the plurality of electrical contacts, wherein a temperature of the second temperature firing is lower than a temperature of the first temperature firing.

9 Claims, 12 Drawing Sheets

(56) References Cited

U.S. PATENT DOCUMENTS

| | | | | |
|---|---|---|---|---|
| 2010/0275995 | A1* | 11/2010 | Kaes | H01L 31/022425 136/258 |
| 2011/0005582 | A1* | 1/2011 | Szlufcik | H01L 31/02245 136/252 |
| 2011/0143486 | A1* | 6/2011 | Hama | H01L 31/022425 438/72 |

FOREIGN PATENT DOCUMENTS

| | | | |
|---|---|---|---|
| JP | 2004-6565 A | | 1/2004 |
| JP | 2004-221188 A | | 8/2004 |
| JP | 2005-286013 A | | 10/2005 |
| KR | 10-2009-0075421 A | | 7/2009 |
| KR | 10-2010-0096746 A | | 9/2010 |
| WO | WO 2006/011595 A1 | | 2/2006 |
| WO | WO 2009/128678 A2 | | 10/2009 |
| WO | WO 2009/157079 | * 12/2009 | H01L 31/04 |
| WO | WO 2011/054915 A1 | | 5/2011 |

OTHER PUBLICATIONS

Hofmann et al., "Industrial Type CZ Silicon Solar Cells With Screen-Printed Fine Line Front Contacts and Passivated Rear Contacted by Laser Firing", 23rd European Photovoltaic Solar Energy Conference, Valencia, Spain, pp. 1704-1707, Sep. 1-5, 2008.

Hörteis et al., "Fundamental Studies on the Front Contact Formation Resulting in a 21% Efficiency Silicon Solar Cell With Printed Rear and Front Contacts", IEEE, pp. 000672-000677, 2010.

Nekarda et al., "Comparsion of three different metallization concepts for LFC cells", 25th European Photovoltaic Solar Energy Conference and Exhibition / 5th World Conference on Photovoltaic Energy Conversion, Valencia, Spain, pp. 2245-2249, Sep. 6-10, 2010.

Nekarda J-F et al.: "Comparision of Three Different Metallization Concepts for LFC Cells,"25th European Photovoltaic Solar Energy Conference and Exhibition/5th World Conference on Photovoltaic Energy Coversion, Sep. 8, 2010, 2CV.3.49.

Author Unknown, "Solar cell," Wikipedia, the free encyclopedia, Aug. 26, 2010, pp. 1-30, XP-55237690.

* cited by examiner

SOLAR CELL AND MANUFACTURING METHOD THEREOF

CROSS-REFERENCE TO RELATED APPLICATION

This application claims priority to and the benefit of Korean Patent Application Nos. 10-2010-0083549 and 10-2010-0088890 filed in the Korean Intellectual Property Office on Aug. 27, 2010 and Sep. 10, 2010, respectively, the entire contents of which are incorporated herein by reference.

BACKGROUND OF THE INVENTION

Field of the Invention

Embodiments of the invention relate to a solar cell and a manufacturing method thereof.

Description of the Related Art

A solar cell generally includes a substrate and an emitter region, each of which is formed of a semiconductor, and a plurality of electrodes respectively connected to the substrate and the emitter region. The semiconductors forming the substrate and the emitter region have different conductivity types, such as a p-type and an n-type. A p-n junction is formed at an interface between the substrate and the emitter region.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter region) and the separated holes move to the p-type semiconductor (e.g., the substrate). The electrons and holes are respectively collected by the electrode electrically connected to the emitter region and the electrode electrically connected to the substrate. The electrodes are connected to each another using electric wires to thereby obtain electric power.

SUMMARY OF THE INVENTION

An embodiment of the invention is directed to providing a method for manufacturing a solar cell, the method including: forming a passivation layer on a rear surface of a substrate of a first conductivity type; forming connecting electrodes having a plurality of electrical contacts that are in contact with the rear surface of the substrate by using a first paste for a first temperature firing on portions of the passivation layer; and forming a rear electrode layer by using a second paste for a second temperature firing on the passivation layer and the plurality of electrical contacts, wherein a temperature of the second temperature firing is lower than a temperature of the first temperature firing.

The connecting electrodes may achieve electrical contact with the rear surface of the substrate by thermally treating the first paste for the first temperature firing formed on the passivation layer.

Back surface field regions may be formed at an interface between the connecting electrodes and the substrate by the thermal treatment.

The connecting electrodes may be in electrical contact with the substrate through via holes formed in the passivation layer. The via holes may be formed by a laser or by an etching paste.

The connecting electrodes may be provided with back surface field regions at an interface between the connecting electrode and the substrate by the thermal treatment.

In the forming of the connecting electrodes, the first paste may be locally spaced apart in a form of dots so as to be in contact with the rear surface of the passivation layer, and the first paste may locally penetrate the passivation layer by a thermal treatment, and then a conductive material contained in the first paste may penetrate into the substrate.

The method may further include: forming an emitter region of a second conductivity type on the substrate, the second conductivity type being opposite to the first conductivity type; applying a front electrode paste to form a front electrode region over the emitter region; and forming the front electrode region to be electrically connected to the emitter region by thermally treating the front electrode paste.

The forming of connecting electrodes and the forming of the front electrode region may be carried out simultaneously by the same thermal treatment process.

The temperature in the forming of connecting electrodes and the forming of a front electrode region is the temperature of the first temperature firing, which may range from 750° C. to 800° C.

The temperature in the forming of a rear electrode layer is the temperature of the second temperature firing, which may range from 200° C. to 500° C.

The method may further include, between the forming of the passivation layer and the forming of connecting electrodes, forming via holes in the passivation layer so that portions of the rear surface of the substrate are exposed through the passivation layer, wherein, in the forming of the connecting electrodes, the first paste may be applied to the exposed portions so as to make contact with the portions of the rear surface of the substrate through the via holes of the passivation layer, and a conductive material contained in the first paste may penetrate into the substrate by a thermal treatment.

The conductive material contained in the first paste may be aluminum (Al).

Another embodiment of the invention is directed to providing a method for manufacturing a solar cell, the method including: forming a passivation layer on a rear surface of a substrate of a first conductivity type; forming a rear electrode paste to form rear electrodes on the passivation layer, and locally thermally treating portions of the rear electrode paste to make electrical contact through the passivation layer before the rear electrode paste is dried; and forming the rear electrodes by thermally treating the entire rear electrode paste.

The local thermal treatment on the contact portions for making electrical contact through the passivation layer may be performed by a laser.

The method may further include: forming an emitter region of a second conductivity type on the substrate, the second conductivity type being opposite to the first conductivity type; applying a front electrode paste over the emitter region; and forming a front electrode region to be electrically connected to the emitter region by thermally treating the front electrode paste.

The forming of the rear electrodes by thermally treating the entire rear electrode paste and the forming of a front electrode region are carried out simultaneously by the same thermal treatment process.

Yet another embodiment of the invention is directed to providing a solar cell, including: a substrate of a first conductivity type; an emitter region of a second conductivity type that forms a p-n junction with the substrate, the second conductivity type being opposite to the first conductivity type; a passivation layer positioned on a rear surface of the substrate and having a plurality of via holes exposing parts of the substrate; rear electrodes positioned on the rear surface of the passivation layer, and parts of the rear electrodes being connected to the substrate through the plurality of via holes; and back surface field regions formed by doping conductive material of the rear electrodes around portions of the rear electrodes that penetrate into the substrate, wherein the rear electrodes are connected to the substrate at the portions of the rear electrodes or the conductive material of the rear electrodes that penetrate into the substrate.

The conductive material of the rear electrodes may penetrate into the substrate, and the rear electrodes may include a eutectic layer where crystalline particles of the conductive material of the rear electrodes and crystalline particles of silicon (Si) material contained in the substrate are mixed together in the portions of the rear electrodes penetrating into the substrate.

The content of the conductive material contained in the eutectic layer may be greater than the content of the conductive material diffused over the back surface field regions, and the content of the silicon material contained in the eutectic layer may be less than the content of the silicon material contained in the back surface field regions.

Part of the rear electrodes penetrates into the substrate, and ends of the portions of the rear electrodes penetrating into the substrate and connected to the substrate may have a curved shape.

Portions of the plurality of via holes that are closer to the substrate have diameters that are smaller than portions those of portions of the plurality of via holes that are farther from the substrate.

The solar cell may further include front electrodes electrically connected to the emitter region, and may further include rear bus bars electrically connected to the rear electrodes.

BRIEF DESCRIPTION OF THE DRAWINGS

The implementation of embodiments of the invention will be described in detail with reference to the following drawings in which like numerals refer to like elements.

DETAILED DESCRIPTION OF THE EMBODIMENTS

Figure 1:
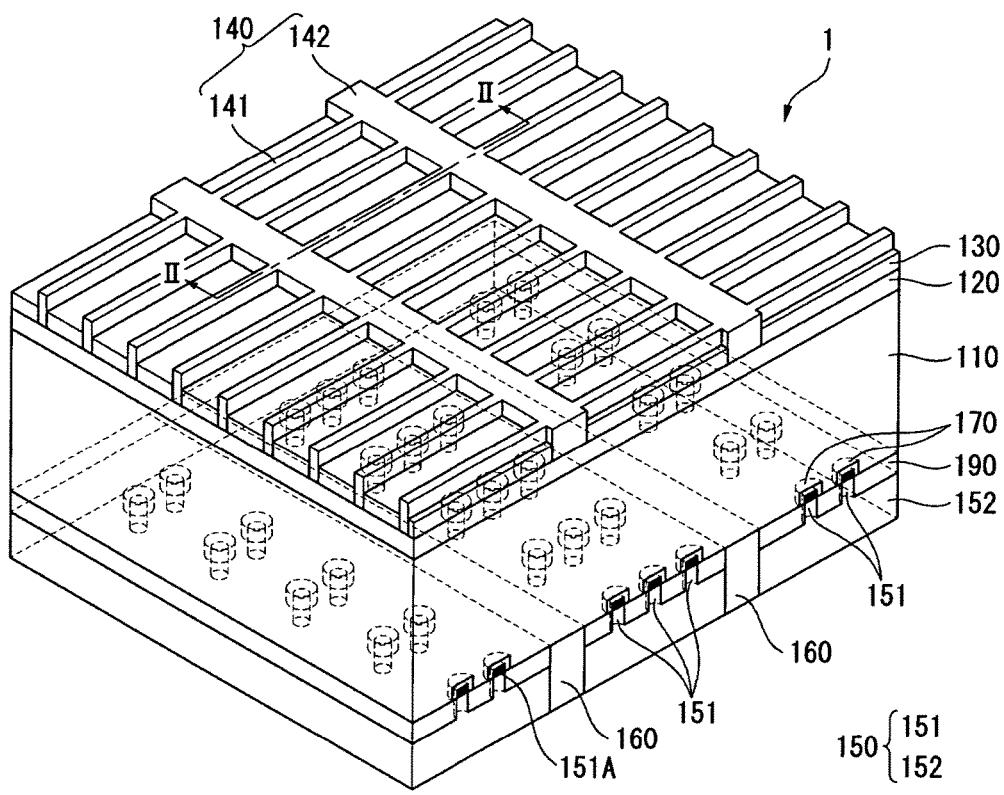
FIG. 1 is a partial perspective view of a solar cell according to a first example embodiment of the invention.

The invention will be described more fully hereinafter with reference to the accompanying drawings, in which example embodiments of the inventions are shown. This invention may, however, be embodied in many different forms and should not be construed as limited to only the embodiments set forth herein. In order to clarify the example embodiments, parts that are not connected with (or related to) the description will be omitted. Like reference numerals designate like elements throughout the specification.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element is referred to as being "entirely" on another element, it may be on the entire surface of the other element and may not be on a portion of an edge of the other element.

Referring to the drawings, a solar cell and a method for manufacturing the solar cell according to an example embodiment of the invention will be described.

First, a solar cell according to a first example embodiment of the invention will be described with reference to FIGS. 1 to 4f.

Figure 2:
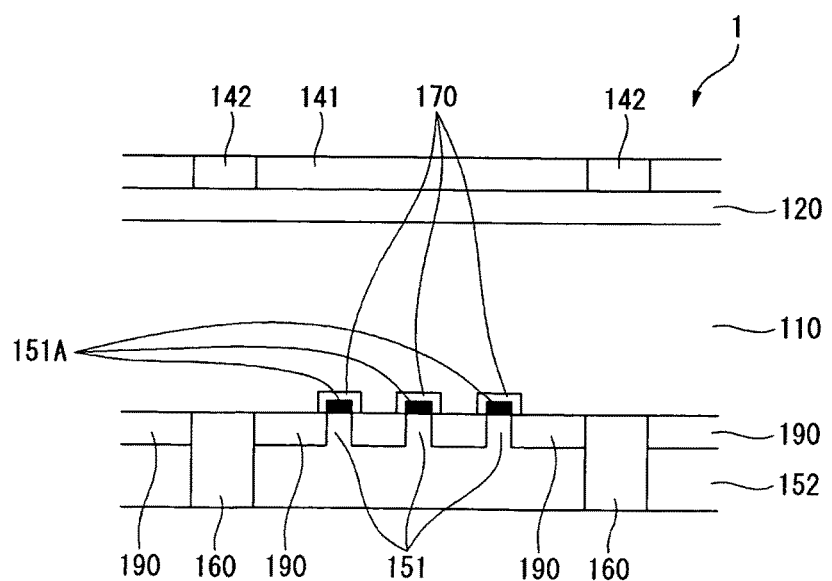
FIG. 2 is a cross-sectional view taken along line II-II of the solar cell shown in FIG. 1.

FIG. 1 is a partial perspective view of a solar cell according to a first example embodiment of the invention. FIG. 2 is a cross-sectional view taken along line II-II of the solar cell shown in FIG. 1.

Referring to FIG. 1, a solar cell 1 according to a first example embodiment of the invention comprises a substrate 110, an emitter region 120 positioned in (at) a surface (hereinafter, referred to as 'a front surface') of the substrate 110 on which light is incident, an anti-reflection layer 130 on the emitter region 120, a passivation layer 190 positioned on a rear surface of the substrate 110 facing the front surface of the substrate 110, a front electrode region having a plurality of finger electrodes (front electrodes) 141 electrically connected to the emitter region 120 and a plurality of front bus bars 142 connected to the plurality of finger electrodes 141 and extending to cross the plurality of finger electrodes 141, a rear electrode 150 positioned on the passivation layer 190 being electrically connected to the substrate 110 and having a plurality of first portions 151 and second portions 152, a plurality of rear bus bars 160 positioned on the passivation layer 190, and electrically connected to the second portions 152 of the rear electrode 150, and a plurality of back surface field (BSF) regions 170 positioned between the first portions 151 and the substrate 110.

The substrate 110 is a semiconductor substrate formed of, for example, first conductivity type silicon, such as p conductivity type silicon. In this instance, the silicon may be monocrystalline silicon, polycrystalline silicon, or amorphous silicon. If the substrate 110 is of the p conductivity type, the substrate 110 may contain a group III element impurity such as boron (B), gallium (Ga), and indium (In).

Alternatively, the substrate 110 may be of an n conductivity type, and may be a semiconductor material other than silicon. If the substrate 110 is of the n conductivity type, the substrate 110 may contain a group V element impurity such as phosphorus (P), arsenic (As), and antimony (Sb).

The substrate 110 may be textured to form a textured surface that is an uneven surface.

The emitter region 120 is an impurity region containing an impurity of a second conductivity type (e.g., an n conductivity type impurity), which is opposite to the first conductive type of the substrate 110. The emitter region 120 forms a p-n junction with the semiconductor substrate 110.

By a built-in potential difference generated due to the p-n junction, electron-hole pairs, which are generated by incident light onto the substrate 110, are separated into electrons and holes, respectively, and the separated electrons move toward the n-type semiconductor and the separated holes move toward the p-type semiconductor.

Thus, when the substrate 110 is of the p-type and the emitter region 120 is of the n-type, the separated holes move toward the substrate 110 and the separated electrons move toward the emitter region 120. Accordingly, the holes become majority carriers in the substrate 110, and the electrons become majority carriers in the emitter region 120.

Hence, the substrate 110 and the emitter region 120 form a p-n junction. If the substrate 110 is of an n conductivity type, the emitter region 120 will be of a p conductivity type. In this instance, the separated electrons move toward the substrate 110, and the separated holes move toward the emitter region 120.

When the emitter region 120 is of the n-type, the emitter region 120 may be formed by doping the substrate 110 with the group V element impurity such as P, As, and Sb, while, when the emitter region 120 is of the p conductivity type, the emitter region 120 may be formed by doping the substrate 110 with the group III element impurity such as B, Ga, and In.

The anti-reflection layer 130 made of a silicon nitride film ($SiN_x$), a silicon oxide film ($SiO_2$), a silicon oxide nitride film ($SiO_xN_y$), etc., is formed on the emitter region 120. The anti-reflection layer 130 reduces reflectance of light incident on the solar cell 1 and increases selectivity of a specific wavelength band, thereby increasing efficiency of the solar cell 1.

The anti-reflection layer 130 may have a thickness of about 70 nm to 80 nm. The anti-reflection layer 130 may be omitted if required or desired.

The passivation layer 190 is positioned on the rear surface of the substrate 110. The passivation layer 190 reduces the recombination rate of charges around the surface of the substrate 110 and increases the inner reflectance of light passing through the substrate 110 to thereby increase the re-incidence of the light passing through the substrate 110.

The passivation layer 190 may have a single-layered or doubled-layered structure. The light passing through the substrate 110 is reflected by the passivation layer 190 having the single-layered or double layered structure, and is re-incident toward the substrate 110. In this instance, the recombination rate of the light can be improved by controlling the refractive index of a layer forming the passivation layer.

The plurality of finger electrodes 141 are positioned on the emitter region 120, are electrically connected to the emitter region 120, and extend in a predetermined direction, spaced apart from each other. The plurality of finger electrodes 141 collect charges moving toward the emitter region 120, for example, electrons.

The plurality of front bus bars 142 are positioned on the same layer as the plurality of finger electrodes 141 over the emitter region 120, and extend to cross the plurality of finger electrodes 141. The plurality of front bus bars 142 collect the charges collected and moved by the plurality of finger electrodes 141, and output them to an external device.

The finger electrodes 141 and the front bus bars 142 are made of at least one conductive material. Examples of such a conductive material may comprise at least one selected from the group consisting of nickel (Ni), copper (Cu), aluminum (Al), tin (Sn), zinc (Zn), indium (In), titanium (Ti), gold (Au), and a combination thereof. Other conductive metal materials may be used.

The finger electrodes 141 and the front bus bars 142 may have a minimum thickness of about 20 um, for example, between 20 um to 40 um.

As shown in FIG. 1, each of the rear electrodes 150 comprises a conductive material, and has a plurality of first portions 151 (hereinafter, referred to as 'connecting electrodes') passing through the passivation layer 190 and contacting with some part of the substrate 110 and a second portion 152 (hereinafter, referred to as a 'rear electrode layer') substantially positioned on the passivation layer 190, except the rear bus bars 160 and connected to the connecting electrodes 151.

The connecting electrodes 151 disposed at regular intervals may have various shapes such as a circular shape, an elliptical shape, or a polygonal shape, and penetrate the passivation layer 190 to come into contact with the substrate 110. The connecting electrodes 151 collect charges, for example, electrons, moving toward the substrate 110, and transfer them to the rear electrode layer 152.

Part of the connecting electrodes 151 penetrates into the substrate 110 through via holes and is connected to the substrate 110. Here, the connecting electrodes 151 may comprise a eutectic layer 151A where the crystalline particles of the conductive material of the connecting electrodes 151 and the crystalline particles of the silicon (Si) material contained in the substrate 110 are mixed together in the portions penetrating into the substrate 110. The eutectic layer 151A will be described later in greater detail. The rear electrode layer 152 may have a minimum thickness of about 20 um, for example, between 20 um to 40 um, and is connected to the connecting electrodes 151 in the crossing direction to form an electrode layer in a direction parallel to the rear surface of the substrate 110.

The conductive material constituting the connecting electrodes 151 or rear electrode layer 152 may comprise at least one selected from the group consisting of nickel (Ni), copper (Cu), aluminum (Al), tin (Sn), zinc (Zn), indium (In), titanium (Ti), gold (Au), and a combination thereof. Other conductive metal materials may be used.

In this embodiment, part of the connecting electrodes 151 in contact with the substrate 110 may contain only the components of the rear electrode layer 152, or may have the components of the passivation layer 190 and substrate 110 mixed together, as well as the components of the rear electrode layer 152. Alternatively, as in the above-mentioned eutectic layer 151A, the crystalline particles of the silicon (Si) material of the substrate 110 and the crystalline particles of the conductive material of the connecting electrodes 151 may be mixed together.

The plurality of rear bus bars 160 extending in the same direction as the front bus bars 142 are positioned over the passivation layer 190. In this instance, the rear bus bars 160 may be disposed at a position facing the front bus bars 142. Accordingly, the rear bus bars 160 and the front bus bars 142 may be aligned.

Although FIGS. 1 and 2 illustrate that the plurality of rear bus bars 160 penetrate the passivation layer 190 and come into contact with the substrate 110, the plurality of rear bus bars 160 may be spaced apart from the substrate 110 and positioned on top of the passivation layer 190 without passing through the passivation layer 190 in a manner different from that described above.

In an alternate example embodiment, the rear bus bars 160 may comprises a plurality of conductors having a circular shape or polygonal shape which are disposed at regular intervals.

The plurality of rear bus bars 160 collect charges, for example, holes, transferred from the connecting electrodes 151 through the rear electrode layer 152, and output them to the external device.

The plurality of rear bus bars 160 are made of at least one conductive material. Examples of the conductive material may comprise at least one selected from the group consisting of nickel (Ni), copper (Cu), aluminum (Al), tin (Sn), zinc (Zn), indium (In), titanium (Ti), gold (Au), and a combination thereof, or otherwise may contain other conductive materials.

A plurality of back surface field regions 170 are positioned between the connecting electrodes 151 and the substrate 110. The plurality of back surface field regions 170 are more heavily doped with an impurity of the same conductivity type as the substrate 110 than the substrate 110. Accordingly, if the substrate is a p-type substrate, the back surface field regions may be p+ areas, while if the substrate is of an n-type substrate, the back surface field regions may be n+ areas.

Due to a difference in the concentration of an impurity between the substrate 110 and the back surface field regions 170, a potential barrier is formed, and this disturbs the movement of electrons towards the rear surface of the substrate 110, thereby reducing or preventing a recombination and/or disappearance of electrons and holes near the rear surface of the substrate 110.

Meanwhile, the aforementioned eutectic layer 151A of the connecting electrodes 151 is formed by a thermal treatment process occurring during the formation of the back surface field regions 170, which is a layer in which the crystalline particles of the conductive material of the connecting electrodes 151 and the crystalline particles of the silicon (Si) material contained in the substrate 110 are mixed together in the portions of the substrate 110 into which the conductive material of the connecting electrodes 151 penetrates.

For example, if the connecting electrodes 151 contain aluminum (Al), the eutectic layer 151A may have the aluminum (Al) crystalline particles and the silicon (Si) crystalline particles that are mixed together. The mixing of the aluminum (Al) crystalline particles and the silicon (Si) crystalline particles may be regular.

The eutectic layer 151A of the connecting electrodes 151 has the effect of preventing or reducing the generation of a void (i.e., empty space) between the back surface field regions 170 and the connecting electrodes 151 during the formation of the back surface field regions 170.

Accordingly, the eutectic layer 151A of the connecting electrodes 151 further improves electrical contact between the connecting electrodes 151 and the back surface field regions 170, thereby improving the incident photon-to-current conversion efficiency of the solar cell.

The content of the conductive material of the eutectic layer 151A of the connecting electrodes 151 may be greater than the content of the conductive material diffused over the back surface field regions 170, and the content of the silicon material contained in the eutectic layer 151A of the connecting electrodes 151 may be less than the content of the silicon material contained in the back surface field regions 170.

Accordingly, when the holes move from the back surface field regions 170 to the connecting electrodes 151, the resistance becomes gradually smaller, thereby facilitating the flow of the holes. Also, the silicon (Si) material of the substrate 110 and the conductive material of the connecting electrodes 151 are more firmly coupled to each other on the eutectic layer 151A, thereby further decreasing the contact resistance between the substrate 110 and the connecting electrodes 151.

The operation of the solar cell 1 having the above structure according to the example embodiment will be described below.

When light is irradiated to the solar cell 1 and is incident on the semiconductor substrate 110 through the anti-reflection layer 130 and the emitter region 120, electron-hole pairs are generated in the semiconductor substrate 110 by light energy. In this instance, the reflection loss of light incident on the substrate 110 is reduced because of the anti-reflection layer 130, thereby further increasing the amount of light incident on the substrate 110.

These electron-hole pairs are separated from one another by the p-n junction between the substrate 110 and the emitter region 120, and therefore the holes move toward the p conductivity type substrate 110 and the electrons move toward the n conductivity type emitter region 120.

In this way, the electrons that moved to the emitter region 120 are collected by the finger electrodes 141 and are transferred to and collected by the front bus bars 142, while the holes that moved to the substrate 110 are transferred to the neighboring connecting electrodes 151 through the back surface field regions 170 and then are transferred to the rear electrode layer 152 and collected by the rear bus bars 160.

The front bus bars 142 and the rear bus bars 160 are connected to each other using electric wires, and thus current flows therebetween. The current is externally used as an electric power.

Moreover, since the passivation layer 190 having a single-layered or double-layered structure is positioned between the substrate 110 and the rear electrode layer 152, the recombination rate of charges caused by an unstable bond on the surface of the substrate 110 is significantly decreased, thereby improving the efficiency of the solar cell.

FIGS. 3a to 3h are views for explaining one example of a method for manufacturing the solar cell shown in FIGS. 1 and 2.

Figure 3A:
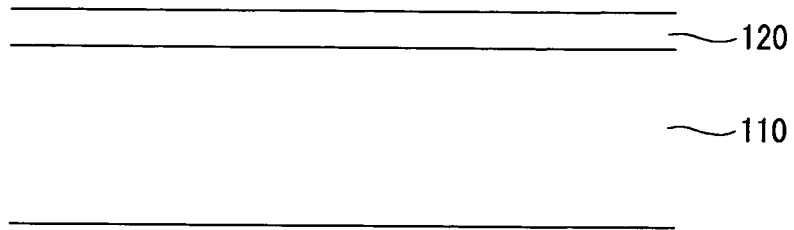
FIGS. 3a to 3h are views for explaining one example of a method for manufacturing the solar cell shown in FIGS. 1 and 2.

First, as shown in FIG. 3a, a material or a gas, for example, $POCL_3$ or $H_3PO_4$, containing an impurity of a group V element, such as phosphor (P), arsenic (As), and antimony (Sb), is thermally treated on the substrate 110 made of p-type monocrystalline or polycrystalline silicon at a high temperature to diffuse the impurity of the group V element on the substrate 110, thereby forming an emitter region 120 on the front surface of the substrate 110.

On the other hand, after the emitter region 120 is formed on the front surface, rear surface, and side surfaces of the substrate 110 by diffusing the impurities on the entire surface of the substrate 110, the emitter region 120 formed on the rear surface of the substrate 110 can be removed by using a wet or dry etching method.

Unlike this example embodiment, in the instance that the conductivity type of the substrate 110 is an n type, a material or a gas, for example, $B_2H_6$, containing an impurity of a group III element may be thermally treated at a high temperature or stacked to thus form a p-type emitter region on the front surface of the substrate 110.

Next, an oxide (phosphorous silicate glass, PSG) containing phosphor or an oxide (boron silicate glass, BCG) containing boron, which is produced by the diffusion of a p-type impurity or an n-type impurity into the substrate 110, is removed by an etching process.

If required or desired, before forming the emitter region 120, the front surface of the substrate 110 may be textured to form a textured surface corresponding to an uneven surface.

Figure 3B:
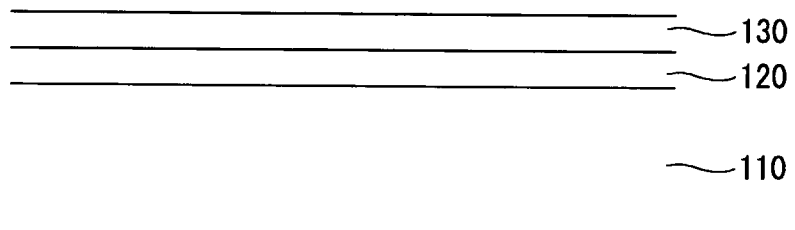

Next, as shown in FIG. 3b, an anti-reflection layer 130 is formed on the front surface of the substrate 110 by a chemical vapor deposition (CVD) method, such as plasma enhanced chemical vapor deposition (PECVD).

Figure 3C:
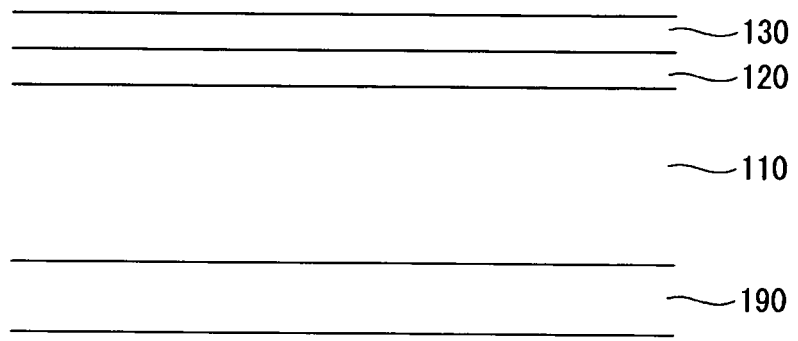

As shown in FIG. 3c, a passivation layer 190 is formed on the rear surface of the substrate 110 by using a chemical vapor deposition method such as PECVD, or various film formation methods, such as sputtering, spin coating, spraying, screen printing, and e-beam evaporation.

The thickness of the film constituting the passivation layer 190 is adjusted in consideration of the thickness of a connecting electrode pattern 51 to be applied over the passivation layer 190 so that the connecting electrodes 151 penetrate the passivation layer and come into contact with the substrate 110 by a thermal treatment process. In this example embodiment, the passivation layer 190 has a thickness of 10 nm to 200 nm, but is not limited thereto.

Figure 3D:
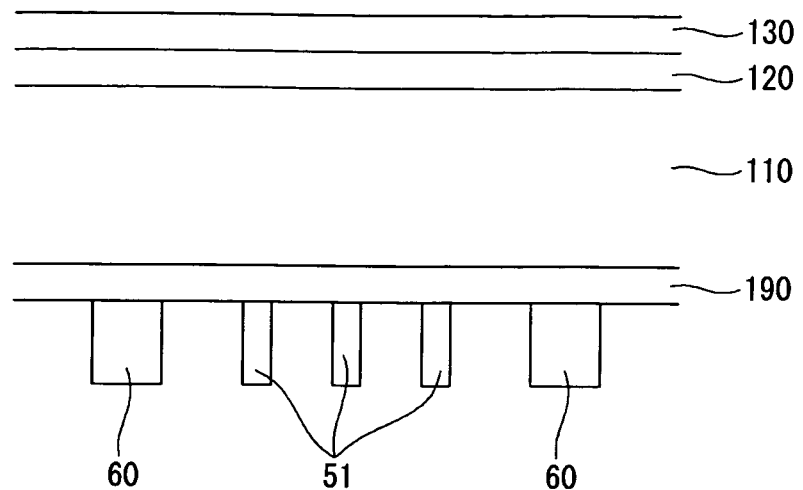

Next, as shown in FIG. 3d, a first paste containing a conductive material is partially or locally spaced apart in the form of dots and applied to contact portions making electrical contact with the substrate using a screen printing method so that it comes into contact with part of the rear surface of the passivation layer 190, and then is dried at about 120° C. to 200° C. to form a connecting electrode pattern 51. The first paste may be a paste to be fired at a high temperature, and the conductive material contained in the first paste may be, for example, aluminum (Al).

In this example embodiment, the connecting electrode pattern 51 may have various shapes such as a circular shape, an elliptical shape, and a polygonal shape at regular intervals, e.g., at intervals of about 0.5 mm to 1 mm, but is not limited thereto. Also, the connecting electrode pattern 51 may have a thickness of 50 nm to 500 nm, but is not limited thereto.

Next, a paste containing silver (Ag) is printed on a corresponding portion of the rear surface of the substrate 110 using a screen printing method and then dried to form a plurality of rear bus bar patterns 60. In this example embodiment, the plurality of rear bus bar patterns 60 are separated from each other and extend in one direction, but the invention is not limited thereto.

Figure 3E:
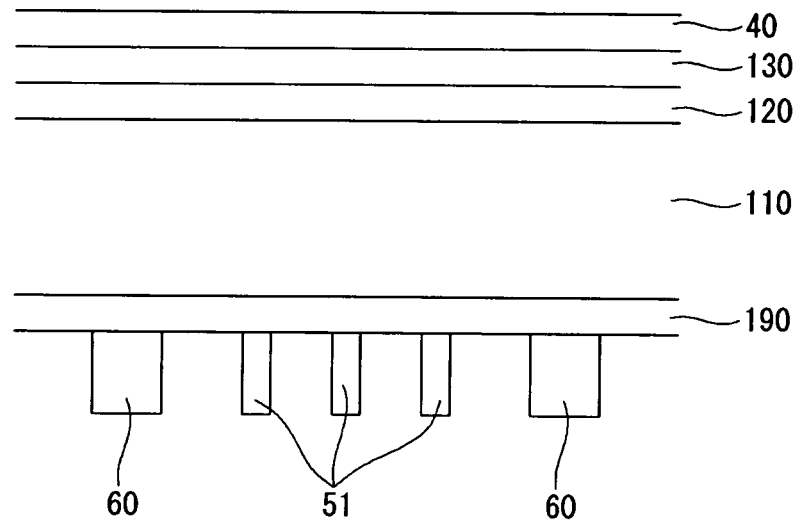

Next, as shown in FIG. 3e, a front electrode paste containing silver (Ag) is printed to form a front electrode region on a corresponding portion of the front surface of the anti-reflection layer 130 using a screen printing method and then dried to form a front electrode region pattern 40 to form finger electrodes 141 and front bus bars 142.

The front electrode region pattern 40 has a finger electrode pattern region and a front bus bar pattern region that extend to cross each other. That is, the front electrode region pattern at each crossings extends in different directions.

The order of formation of the connecting electrode pattern 51, the plurality of rear bus bar patterns 60, the front electrode region pattern 40 may be varied. For example, the front electrode region pattern 40 may be formed first, and then the connecting electrode pattern 51 and the plurality of rear bus bar patterns 60 may be sequentially formed. Also, the order of formation of the connecting electrode pattern 51 and the plurality of rear bus bar patterns 60 may be varied.

The connecting electrode pattern 51, the plurality of rear bus bar patterns 60, the finger electrodes 141, and the front bus bar pattern 40 may have a minimum thickness of about 20 um, for example, between 20 um to 40 um.

Figure 3F:
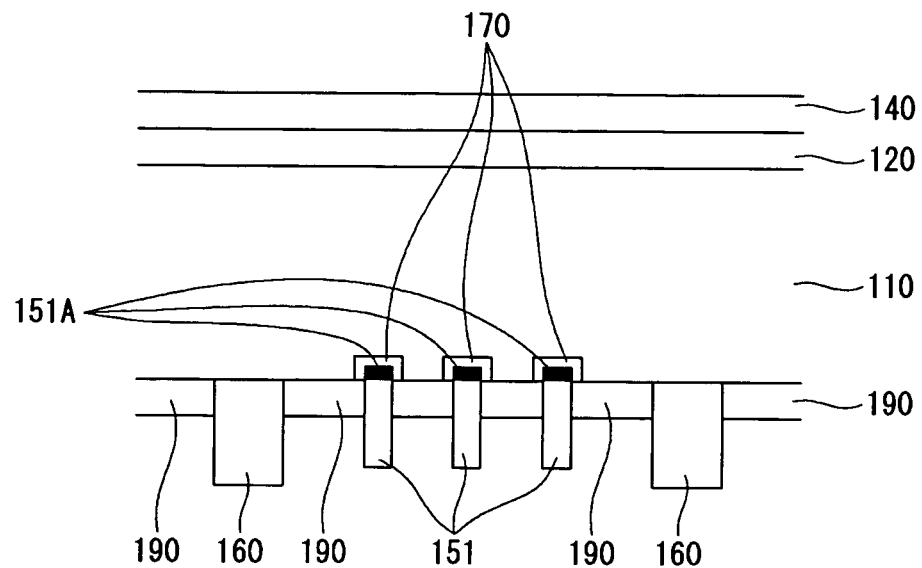

Next, as shown in FIG. 3f, the substrate 110 provided with the connecting electrode pattern 51, the plurality of rear bus bar patterns 60, and the front electrode region pattern 40 are fired at a temperature of about 750° C. to about 800° C. to form connecting electrodes 151, a plurality of rear bus bars 162, a front electrode region 140 comprising finger electrodes 141 and front bus bars 142, and a plurality of back surface field regions 170 together. In this instance, the portions of the connecting electrodes 151 penetrating into the substrate 110 are formed as the eutectic layer 151A, together with the silicon (Si) material, as the conductive material contained in the connecting electrode pattern 51 penetrates into the rear surface of the substrate 110.

In other words, when a heat treatment is applied, lead (Pb) contained in the front electrode region pattern 40 helps the front electrode region pattern 40 to penetrate the anti-reflection layer 130 around the contact portions. Accordingly, the plurality of finger electrodes 141 and the front bus bars 142 contacting the emitter region 120 are formed. The connecting electrode pattern 51 penetrates the passivation layer 190 at the contact portions and becomes the connecting electrodes 151 contacting with the substrate 110.

Moreover, the contact resistance is decreased due to chemical bonds between the metal components contained in the patterns 40, 51, and and the respective contacting layers 120, 110, and 190, thereby improving current flow.

Also, in the thermal treatment process, the conductive material (e.g., aluminum (Al)) contained in the connecting electrodes 151 is diffused toward the substrate 110 contacting the connecting electrodes 151 and is doped thereon, thereby forming a plurality of back surface field regions 170 on the interface between the connecting electrodes 151 and the substrate 110.

In this instance, the plurality of back surface field regions 170 are of the p conductivity type, which is the same conductivity type as the substrate 110. More specifically, the back surface field regions 170 are of the p+ conductivity type because the concentration of an impurity of the back surface field regions 170 is higher than that of the substrate 110.

Meanwhile, as shown in FIG. 3f, when the connecting electrode pattern 51 formed by the first paste penetrates the passivation layer 190 and comes into contact with the substrate 110 by the thermal treatment process, the conductive material contained in the connecting electrode pattern 51 penetrates into the substrate 110, and the silicon (Si) material of the substrate 110 penetrates into the connecting electrode pattern 51.

Afterwards, as the connecting electrode pattern 51 is dried after the thermal treatment, a eutectic layer 151A is formed where the crystalline particles of the conductive material of the connecting electrode pattern 51 and the crystalline particles of the silicon (Si) material contained in the substrate 110 are mixed together in the portions penetrating into the substrate 110.

The eutectic layer 151A is able to prevent or reduce the generation of a void (i.e., empty space) between the back surface field regions 170 and the connecting electrodes 151.

The content of the conductive material of the eutectic layer 151A may be greater than the content of the conductive material contained in the back surface field regions 170, and the content of the silicon material contained in the eutectic layer 151A of the connecting electrodes 151 may be less than the content of the silicon material contained in the back surface field regions 170.

Figure 3G:
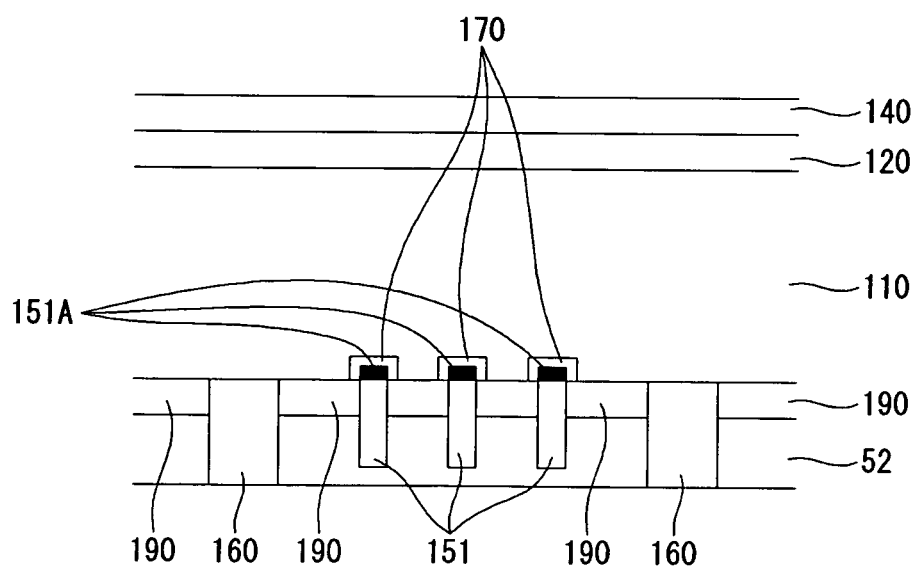

Next, as shown in FIG. 3g, a second paste for low temperature firing and containing aluminum (Al) is applied on the rear surface of the connecting electrodes 151 electrically contacting the substrate 110 and the rear surface of the passivation layer 190 using a screen printing method, for forming a rear electrode layer 152.

Afterwards, the second paste is dried at about 120° C. to 200° C. to form a rear electrode layer pattern 52. In this example embodiment, the rear electrode layer pattern 52 is formed to cover the entire surface of the rear surface of the passivation layer 190.

Figure 3H:
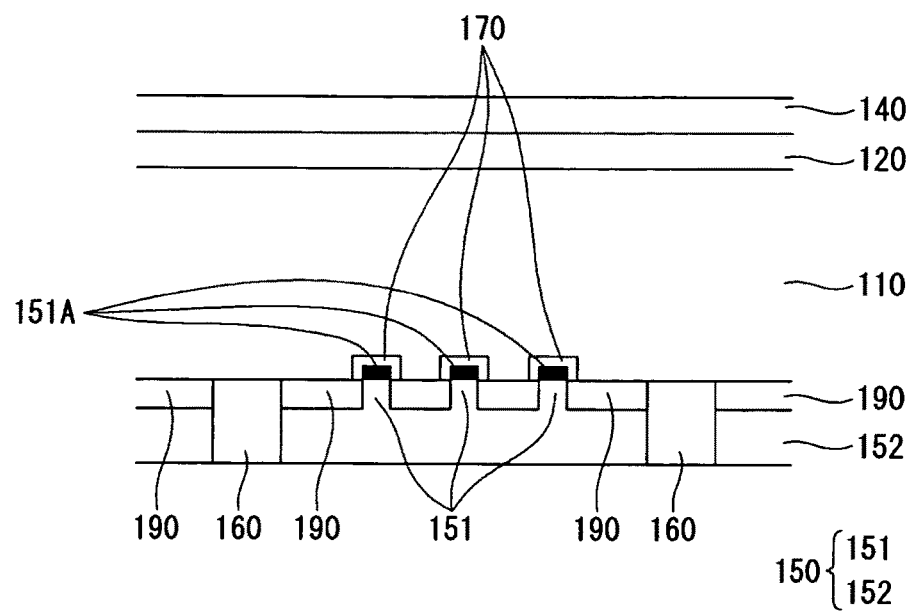

Next, as shown in FIG. 3h, the substrate 110 provided with the rear electrode layer pattern 52 formed by the second paste is fired at a low temperature below about 500° C. to form the rear electrode layer 152 electrically connected to the connecting electrodes 151, thereby completing the solar cell 1 (FIGS. 1 and 2).

In this way, in the instance that the rear electrode layer pattern 52 is fired at a low temperature after the connecting electrode pattern 51 is fired at a high temperature, the series resistance and the characteristics of the back surface field regions 170 are improved as compared to when the connecting electrode pattern 51 and the rear electrode layer pattern 52 are simultaneously applied and fired at a high temperature, thus enabling the manufacture of a solar cell with high efficiency.

That is, when the connecting electrode pattern 51 and the rear electrode layer pattern 52 are simultaneously applied and fired at a high temperature, a void may be formed after the firing because silicon is dissolved toward the rear electrode 150 containing aluminum during the firing due to the characteristic of the solubility of silicon (Si) in aluminum (Al) is higher than the solubility of aluminum (Al) in silicon (Si).

In the instance that such a void is formed, the series resistance of the substrate 110 of the solar cell 1 is deteriorated, and the back surface field regions 170 are not properly formed due to the void formed in the thermal treatment process, thereby deteriorating the efficiency of the solar cell 1.

On the other hand, as in the example embodiment, if the connecting electrode pattern 51 is fired at a high temperature of about 750° C. to about 800° C., and then the rear electrode layer pattern 52 is fired at a low temperature less than 500° C., the occupancy rate of the connecting electrodes 151 is not high regardless of the characteristic that the solubility of silicon (Si) in aluminum (Al) is higher than the solubility of aluminum (Al) in silicon (Si). Thus, no void is generated between the substrate 110 and the connecting electrode 151.

Accordingly, the solar cell 1 with low series resistance can be manufactured, and a plurality of back surface field regions 107 can be easily formed between the connecting electrodes 151 and the substrate 110. Thus, it is possible to manufacture the solar cell 1 with high efficiency.

Moreover, in the high-temperature firing process, the connecting electrode pattern 51 formed by the first paste containing aluminum penetrates the passivation layer 190 to form the connecting electrodes 151. Hence, it is unnecessary to form exposed portions (i.e., holes or perforations) of the passivation layer 190, thereby simplifying the manufacturing process and shortening the manufacturing time.

Moreover, the eutectic layer 151A generated by the penetration of the conductive material of the connecting electrodes 151 into the substrate 110 prevents or reduces the generation of a void between the substrate 110 and the connecting electrodes 151, and strengthens the electrical bond between the connecting electrodes 151 and the substrate 110, thereby further improving the contact resistance between the connecting electrodes 151 and the substrate 110.

Next, another example of the method for manufacturing a solar cell according to one example embodiment of the invention will be described with reference to FIGS. 4a to 4f as well as FIGS. 3a to 3h. In this example embodiment, description of identical parts to those of FIGS. 3a to 3h will be omitted.

FIGS. 4a to 4f are views for explaining another example of the method for manufacturing the solar cell of FIGS. 1 and 2.

Figure 4A:
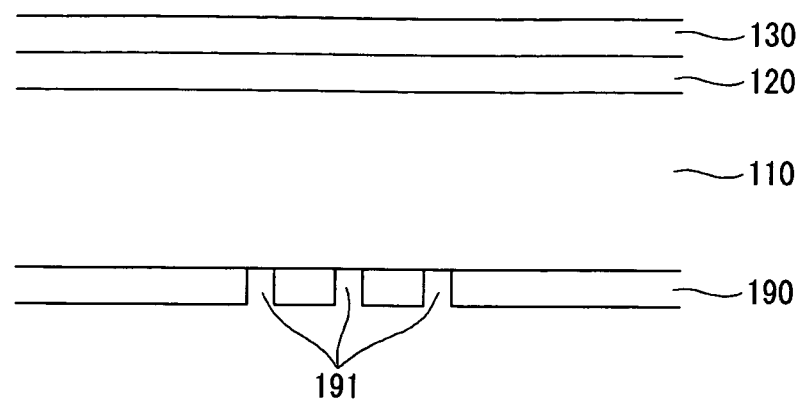
FIGS. 4a to 4f are views for explaining another example of the method for manufacturing the solar cell of FIGS. 1 and 2.

As already shown in FIGS. 3a to 3c, an emitter region 120 and an anti-reflection layer 130 are sequentially formed on the front surface of the substrate 110, and then a passivation layer 190 is formed on the rear surface of the substrate 110. After that, before forming back surface field regions, as shown in FIG. 4a, a laser beam is irradiated partially on the rear surface of the passivation layer 190 to form a plurality of exposed portions (or exposing portions) 191 so that part of the rear surface of the substrate 110 is partially spaced apart and exposed through the passivation layer 190. In this instance, the intensity and wavelength of the laser beam are determined depending on the material or thickness of the passivation layer 190.

Figure 4B:
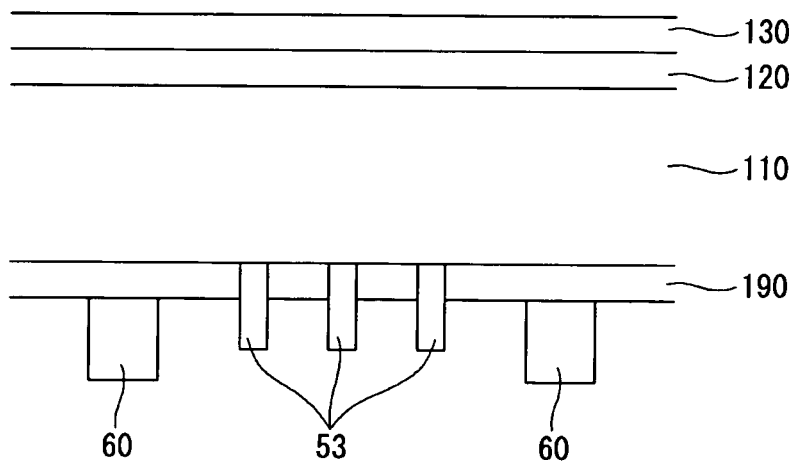

Next, as shown in FIG. 4b, a first paste containing a conductive material is applied to a plurality of exposed portions using a screen printing method or the like so as to make contact with an exposed part of the rear surface of the substrate 110 exposed through the exposed portions 191 to form a connecting electrode pattern 53 and then the connecting electrode pattern 53 is dried. The conductive material of the first paste may be aluminum (Al) or other conductive materials.

Afterwards, a paste containing silver (Ag) is printed on a corresponding portion of the passivation layer 190, except the portion where connecting electrode pattern 53 is formed, using a screen printing method and to form a rear bus bar pattern 60, and then the rear bus bar pattern 60 is dried. The order of formation of the connecting electrode pattern 53 and the rear bus bar pattern 60 may be varied.

Figure 4C:
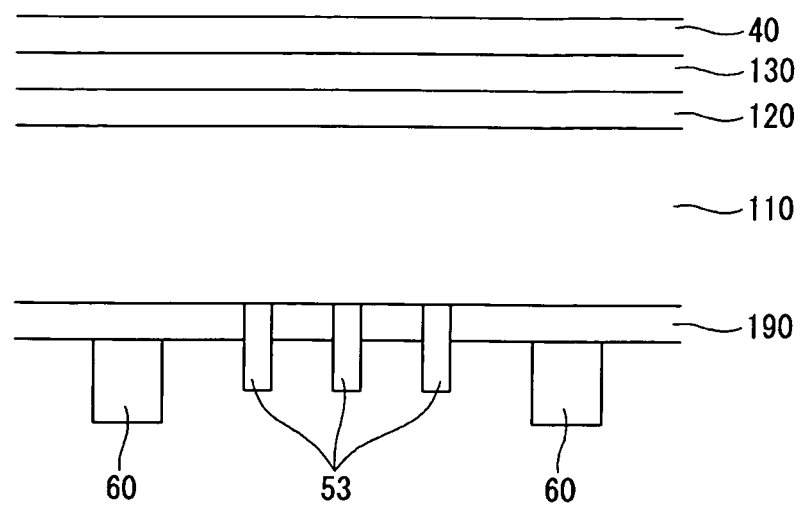

Next, as shown in FIG. 4c, a paste containing silver (Ag) is printed on a corresponding portion of the anti-reflection layer 130 using a screen printing method to form a front electrode region pattern 40, and then the front electrode region pattern 40 is dried. The order of formation of these patterns 40, 53, and 60 may be varied.

Figure 4D:
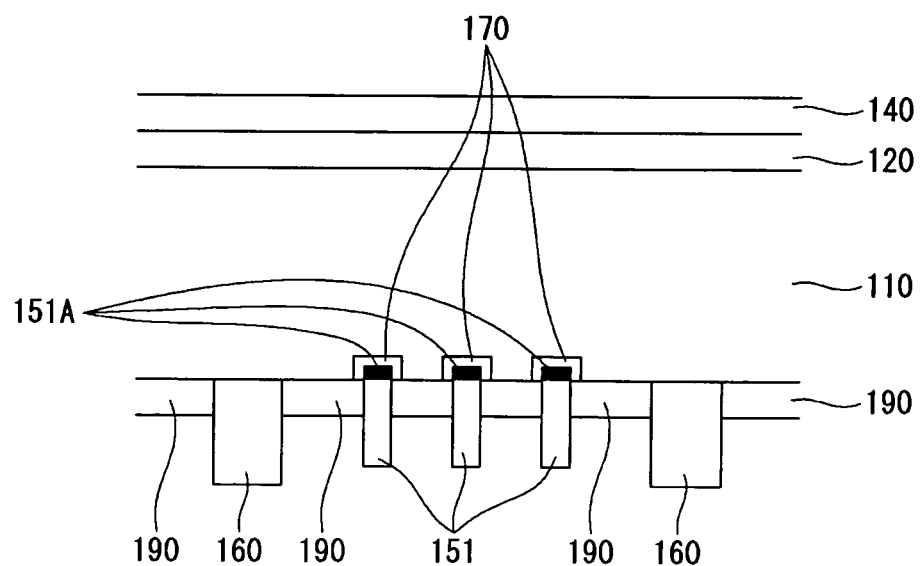

Next, as shown in FIG. 4d, like the method explained in FIGS. 3f to 3h, the substrate 110 provided with the plurality of connecting electrode patterns 53, the plurality of rear bus bar patterns 60, the front electrode region pattern 40 is fired at a temperature of about 750° C. to 800° C., thus forming connecting electrodes 151, a plurality of rear bus bars 162, a plurality of finger electrodes 141, a plurality of front bus bars 142, and a plurality of back surface field regions 170 at once (or simultaneously).

Figure 4E:
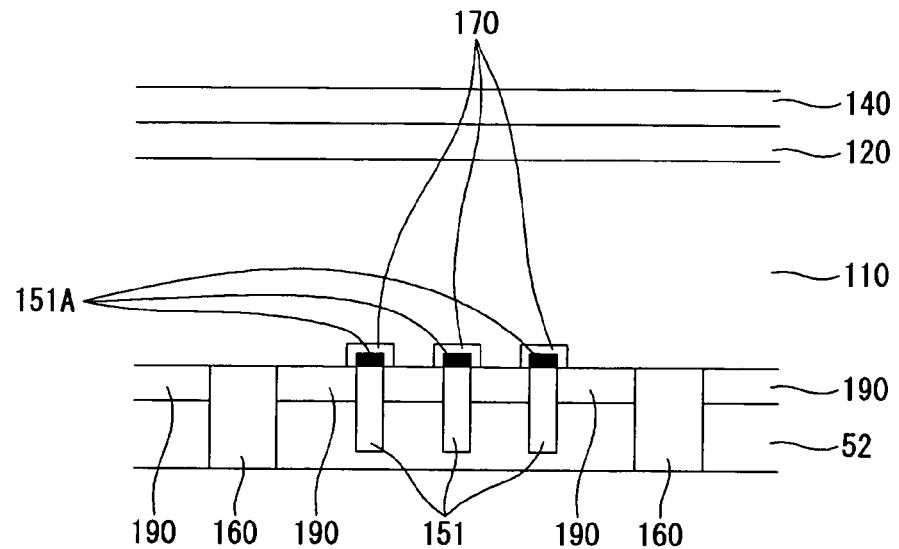

Next, as shown in FIG. 4e, a second paste for low temperature firing and containing aluminum (Al) is applied to the entire rear surface of the passivation layer 190 and is dried to form a rear electrode layer pattern 52.

Figure 4F:
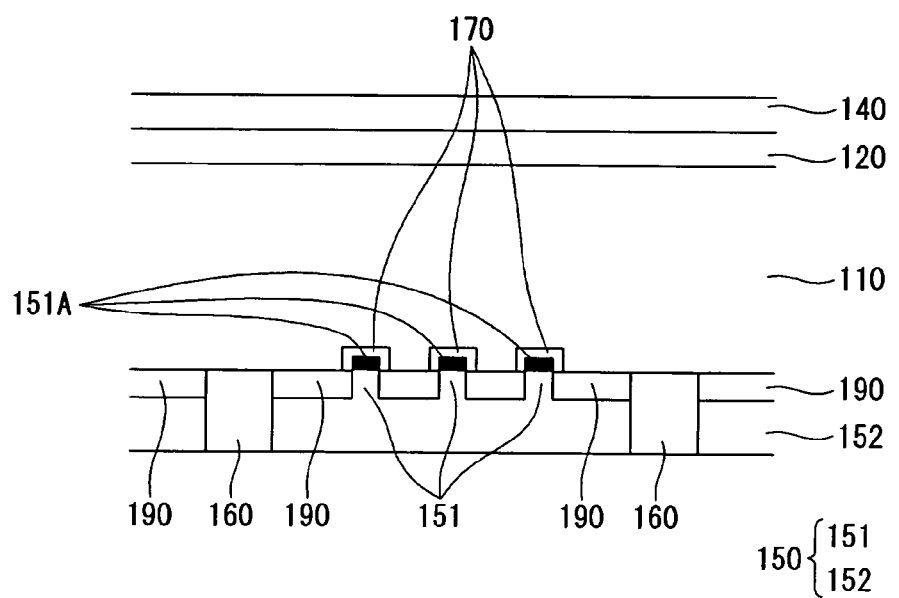

Afterwards, as shown in FIG. 4f, the substrate 110 provided with the rear electrode layer pattern 52 is fired at a low temperature below 500° C. to form a rear electrode layer 152, thereby completing the solar cell 1 (FIGS. 1 and 2).

According to the example embodiment comprising the step of firing the rear electrode layer pattern 52 at a low temperature after firing the connecting electrode pattern 51 at a high temperature, the solar cell 1 can be manufactured to have low series resistance, as compared to simultaneously applying the connecting electrode pattern 51 and the rear electrode layer pattern 52 and firing them at a high temperature, and it is easier to form a plurality of back surface field regions 170 between the connecting electrodes 151 and the substrate 110. Accordingly, it is possible to manufacture the solar cell 1 with high efficiency.

Next, a solar cell and a manufacturing method thereof according to a second example embodiment of the invention will be described with reference to FIGS. 5 to 7h.

Figure 5:
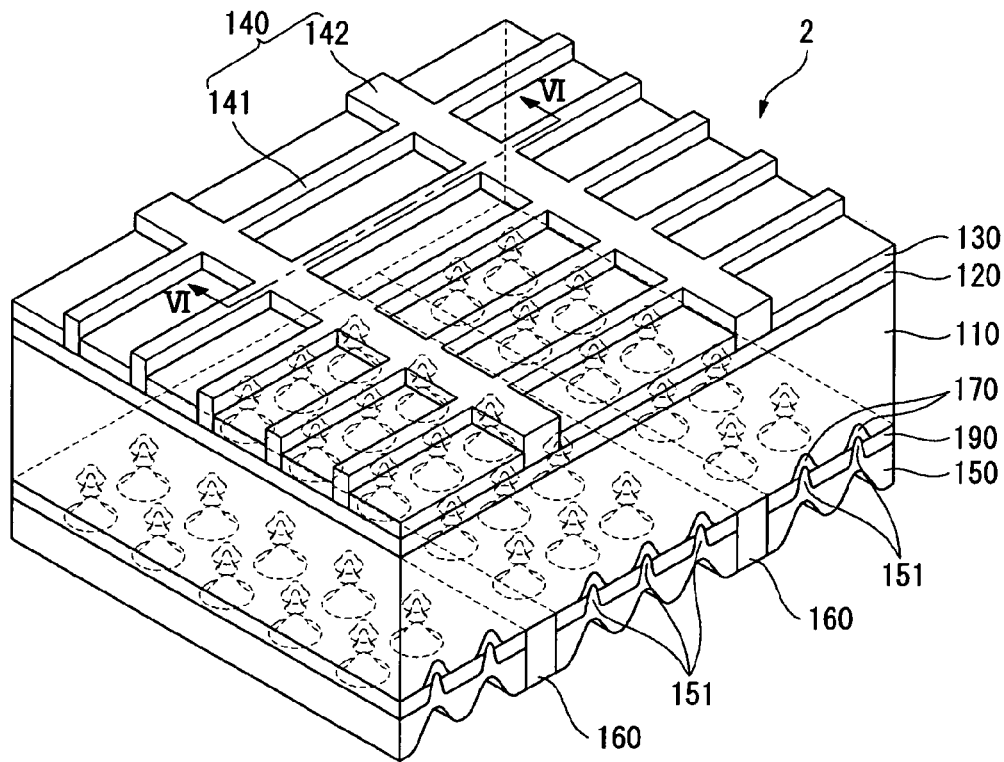
FIG. 5 is a partial perspective view of a solar cell according to a second example embodiment of the invention.
Figure 6:
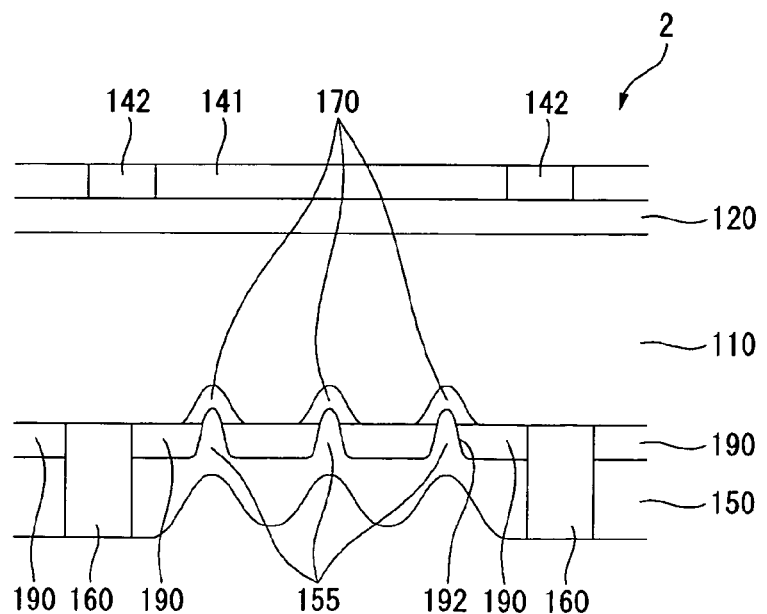
FIG. 6 is a cross-sectional view taken along line VI-VI of the solar cell shown in FIG. 5.

FIG. 5 is a partial perspective view of a solar cell according to a second example embodiment of the invention, and FIG. 6 is a cross-sectional view taken along line VI-VI of the solar cell shown in FIG. 5.

Referring to FIGS. 5 and 6, the solar cell 2 according to the second example embodiment of the invention has the same components, namely, the substrate 110, the emitter region 120, the anti-reflection layer 130, the back surface field regions 170, and the rear bus bars 160, as those of the first example embodiment shown in FIGS. 1 and 2. Accordingly, redundant description thereof will be omitted.

As shown in FIGS. 5 and 6, the solar cell 2 according to the second example embodiment may be provided with a passivation layer 190 and rear electrodes 150 that is different from the solar cell 1 of the first example embodiment.

More specifically, although the function of the passivation layer 190 of the second example embodiment is identical to that of the first example embodiment, a shape of via holes 192 of the passivation layer 190 may be different from that of the first example embodiment.

More specifically, as shown in FIGS. 5 and 6, the plurality of via holes 192 included in the passivation layer 190 in the second example embodiment become smaller in diameter as they go toward (is proximal to, or in parts that are proximal to) the substrate 110 and greater in diameter as they get distant from (is distal to, or in parts that are distal to) the substrate 110.

Moreover, the solar cell 2 according to the second example embodiment may be configured such that a part of the rear electrode 150, i.e., an end of the rear electrode 150, rather than the conductive material of the rear electrode 150, penetrates into the substrate 110 through the via holes 192 of the passivation layer 190 and is connected to the substrate 110.

The rear electrodes 150 of this type may be provided with connecting portions 155 which penetrate into the substrate 110 through the via holes 192 of the passivation layer 190 and are connected to the substrate 110.

The rear electrodes 150 of this embodiment are formed using a paste for the rear electrode by a screen printing method, has a thickness of 20 um to 30 um, and collects charges, for example, holes, moving toward to the substrate 110 through the plurality of connecting portions 155 electrically connected to the substrate 110.

The connecting portions 155 of the rear electrodes 150 of this embodiment may be provided with curved irregular portions. By forming a plurality of irregular portions, the adhesion between each of the connecting portions 155 of the rear electrode 150 and the substrate 110 is improved, thereby decreasing the contact resistance.

The rear electrodes 150 are made of at least one conductive material. Examples of such a conductive material may comprise at least one selected from the group consisting of nickel (Ni), copper (Cu), aluminum (Al), tin (Sn), zinc (Zn), indium (In), titanium (Ti), gold (Au), and a combination thereof. Other conductive metal materials may be used.

Next, referring to FIGS. 7a to 7h, one example of a method for manufacturing a solar cell according to one example embodiment of the invention will be described.

FIGS. 7a to 7h are views for explaining one example of a method for manufacturing the solar cell shown in FIGS. 5 and 6.

Figure 7A:
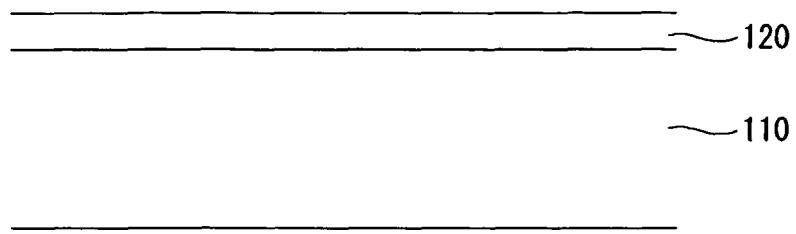
FIGS. 7a to 7h are views for explaining one example of a method for manufacturing the solar cell shown in FIGS. 5 and 6.

First, as shown in FIG. 7a, a material containing an impurity of a group V element is thermally treated on a substrate 110 made of p-type monocrystalline or polycrystalline silicon at a high temperature to diffuse the impurity of the group V element on the substrate 110, thereby forming an emitter region 120 on the front surface of the substrate 110.

Figure 7B:
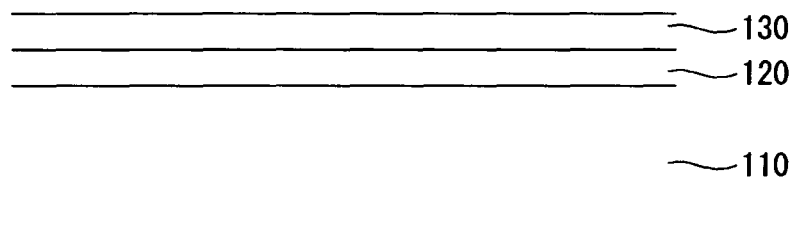

Next, as shown in FIG. 7b, an anti-reflection layer 130 is formed on the front surface of the substrate 110 by a chemical vapor deposition (CVD) method, such as plasma enhanced chemical vapor deposition (PECVD).

Figure 7C:
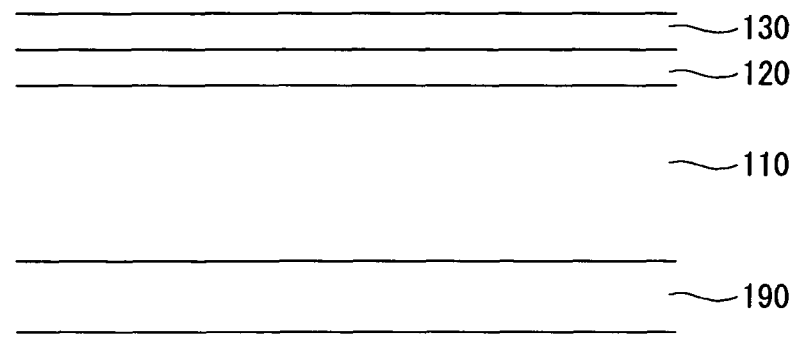

As shown in FIG. 7c, a passivation layer 190 is formed on the rear surface of the substrate 110 by using a chemical vapor deposition method such as PECVD, or various film formation methods, such as sputtering, spin coating, spraying, screen printing, and e-beam evaporation.

The thickness of the film constituting the passivation layer 190 is adjusted in consideration of the thickness of a first paste 50 to be applied over the passivation layer 190 so that the rear electrode 150 come into contact with the substrate 110 by a thermal treatment process. In this example embodiment, the passivation layer 190 has a thickness of 10 nm to 200 nm, but is not limited thereto.

Figure 7D:
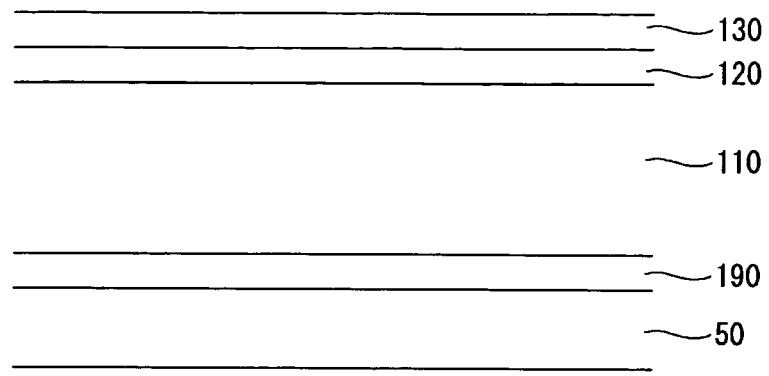

Next, as shown in FIG. 7d, to form rear electrodes 150, a first paste 50 containing aluminum (Al) is applied so as to be in contact with the entire rear surface of the passivation layer 190.

Here, one example of applying the first paste 50 may comprise, for example, a screen printing method. The first paste 50 may comprise, instead of aluminum (Al), at least one selected from selected from the group consisting of nickel (Ni), copper (Cu), aluminum (Al), tin (Sn), zinc (Zn), indium (In), titanium (Ti), gold (Au), and a combination thereof. Other materials may be included.

Figure 7E:
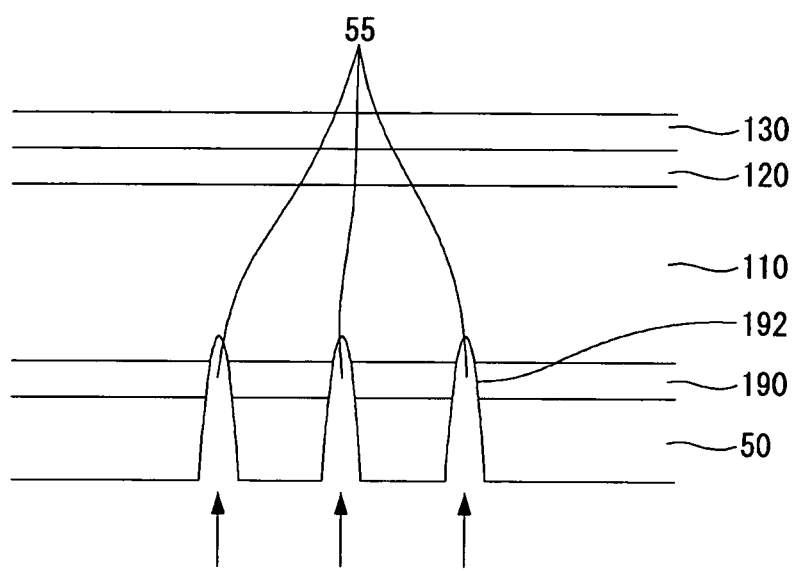

Next, as shown in FIG. 7e, a laser beam is irradiated partially on parts of the first paste 50 to be electrically contacted with the substrate 110 before the first paste 50 applied on the rear surface of the passivation layer 190 is dried, thereby forming via holes 192 in the passivation layer 190 and a plurality of grooves 55 in the rear surface of the substrate 110.

As the laser beam is irradiated, the first paste 50 may be partially spaced apart. Also, the grooves 55 in the substrate 110 formed by the laser beam may be provided with a plurality of curved irregular portions. The intensity and wavelength of the laser beam are determined depending on the material or thickness of the first paste 50 and the passivation layer 190.

Figure 7F:
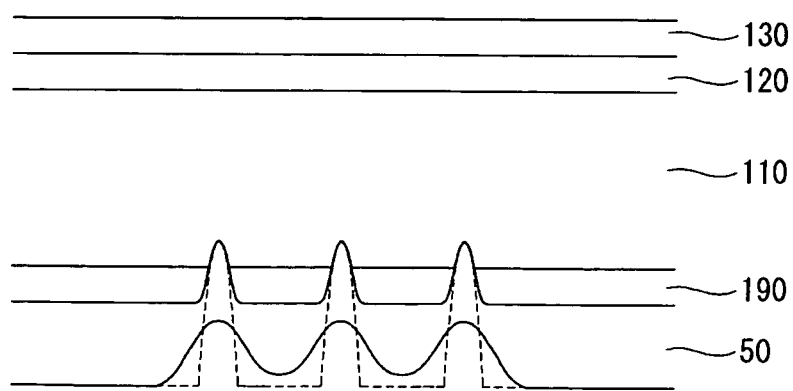

Next, as shown in FIG. 7f, as the first paste 50 is dried at about 120° C. to 200° C., part of the first paste 50 penetrates into the plurality of grooves 55 formed by the laser beam through the via holes 192.

Since the first paste 50 has high cohesiveness, it flows into the plurality of grooves 55 formed in the substrate 110 through the via holes of the passivation layer 190 during the drying process, thus re-connecting the spaced-apart portions of the first paste and filling the grooves 55 of the substrate 110. Accordingly, part of the first paste 50 penetrates into the substrate 110, and is electrically connected to the substrate 110.

Therefore, after the drying process, rear surface regions of the first paste 50 are recessed in the filled regions of the grooves 55 of the substrate 110. Thus, the rear surface regions of the first paste 50 filling the plurality of grooves 55 may be provided with a plurality of irregular portions. In embodiments, the number of the grooves may be equal to the number of irregular portions.

Figure 7G:
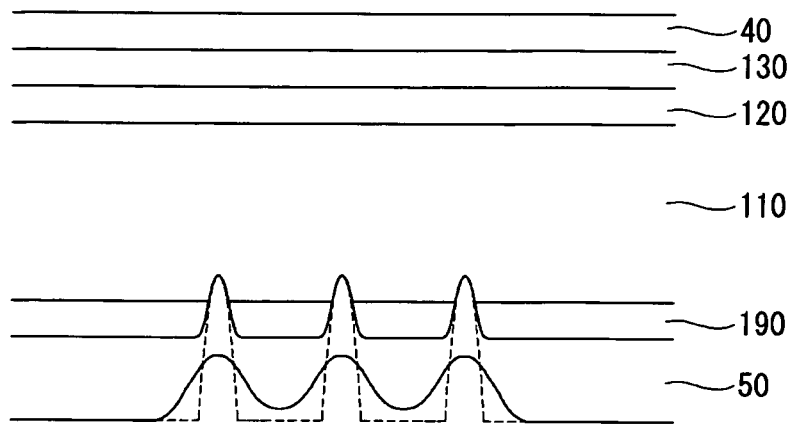

Next, as shown in FIG. 7g, a paste containing silver (Ag) is applied on a corresponding portion of the front surface of an anti-reflection layer 130 using a screen printing method and then dried to apply a paste of a front electrode region pattern 40 on the top front surface of an emitter region depending on the shapes of finger electrodes and front bus bars.

Unlike this example embodiment, first of all, the paste of the front electrode region pattern 40 may be applied on the front top surface of the emitter region, and then the first paste 50 may be applied on the rear surface of the passivation layer 190.

Figure 7H:
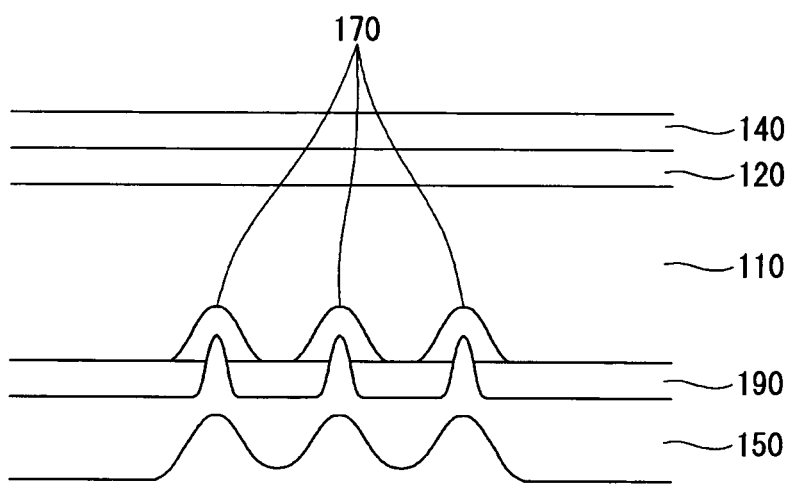

Next, as shown in FIG. 7h, the paste of the front electrode region pattern 40 and the first paste 50 may be fired at a time at a temperature of about 750° C. to about 800° C. to form a front electrode region 140 comprising a plurality of finger electrodes 141 and a plurality of front bus bars 142, rear electrodes 150, and a plurality of back surface field regions 170, thereby completing the solar cell 1 (FIGS. 5 and 6).

As the front electrode region 140 and the rear electrodes 150 are formed by performing the thermal treatment process once, the conductive material (e.g., aluminum (Al)) contained in the rear electrodes 150 is diffused toward the substrate 110 from the connecting portions 155 penetrating into the substrate 110, thereby forming a plurality of back surface field regions 170 between the rear electrodes 150 and the substrate 110.

In this instance, the plurality of back surface field regions 170 are of the p conductivity type, which is the same conductivity type as the substrate 110. More specifically, the back surface field regions 170 are of the p+ conductivity type because the concentration of an impurity of the back surface field regions 170 is higher than that of the substrate 110.

According to the above-described second example embodiment, it is possible to prevent or reduce the generation of a void in the portions connecting between the rear electrodes 150 and the back surface field regions 170. Moreover, a solar cell with higher efficiency can be manufactured because the serial resistance and the characteristics of the back surface field regions 170 are improved.

In embodiments of the invention, the front electrode region pattern 40, the rear bus bar pattern 60, the plurality of connecting electrode patterns 53 and/or other patterns may be formed from an etching paste, from paste containing an etching paste, or from paste containing lead as a component.

Although the example embodiments of the invention have been explained in detail, the scope of the right of the invention is not limited to them, and various modifications and improvements can be made by an ordinarily skilled person within the basic idea of the invention defined in the following claims.

What is claimed is:

1. A method for manufacturing a solar cell, the method comprising:
    forming an emitter region of a second conductivity type on a front surface of a substrate having a first conductivity type that is opposite to the second conductivity type;
    forming an anti-reflection layer on the emitter region;
    forming a passivation layer on a rear surface of the substrate;
    forming via holes in the passivation layer so that portions of the rear surface of the substrate are exposed through the passivation layer, wherein the via holes are formed by irradiating a laser to the passivation layer;
    applying a connecting electrode in the via holes by using a first paste having aluminum;
    applying a bus bar on the passivation layer by using a second paste having silver, wherein the bus bar is spaced apart from the connecting electrode on the passivation layer;
    applying a front electrode on a front surface of the anti-reflection layer by using the second paste having silver;
    performing a first firing operation of firing the connecting electrode, the bus bar and the front electrode at a first temperature;
    forming a rear electrode layer by using a third paste having aluminum on an entire rear surface of the passivation layer except for an area where the bus bar is formed; and
    performing a second firing operation of firing the rear electrode layer at a second temperature lower than the first temperature,
    wherein the first firing operation simultaneously performs the following processes:
    (1) a back surface field region being formed at an interface between the rear surface of the substrate and the connecting electrode;
    (2) the bus bar penetrating into the passivation layer and being contacted to the rear surface of the substrate; and
    (3) the front electrode penetrating into the anti-reflection layer and being connected to the emitter region.

2. The method of claim 1, wherein, in the applying of the connecting electrode, the first paste is locally spaced apart and applied in a form of dots so as to be in contact with a rear surface of the passivation layer.

3. The method of claim 1, wherein the first temperature of the first firing operation ranges from 750° C. to 800° C.

4. The method of claim 1, wherein the second temperature of the second firing operation ranges from 200° C. to 500° C.

5. The method of claim 1, wherein a height of each bus bar is equal to an added height of the connecting electrode and the rear electrode layer.

6. The method of claim 1, wherein the connecting electrode, the front electrode and the bus bar are fired simultaneously by the first firing operation.

7. The method of claim 1, wherein, in the applying of the connecting electrode in the via holes, the first paste contacts the rear surface of the substrate.

8. The method of claim 1, wherein, in the performing of the first firing operation, a eutectic layer including crystalline particles of the aluminum of the connecting electrode and crystalline particles of a silicon material of the substrate is formed between the connecting electrode and the back surface field region.

9. The method of claim 8, wherein a content of the aluminum of the eutectic layer is greater than a content of the aluminum diffused over the back surface field region, and a content of the silicon material contained in the eutectic layer is less than a content of the silicon material contained in the back surface field region.

* * * * *